US 8,263,912 B2

(12) United States Patent
Watanabe

(10) Patent No.: US 8,263,912 B2
(45) Date of Patent: Sep. 11, 2012

(54) NOISE REDUCED PWM DRIVER

(75) Inventor: Hideo Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 1234 days.

(21) Appl. No.: 12/071,716

(22) Filed: Feb. 26, 2008

(65) Prior Publication Data

US 2008/0211550 A1    Sep. 4, 2008

(30) Foreign Application Priority Data

Mar. 2, 2007    (JP) .................................. 2007-52747

(51) Int. Cl.
*H05B 1/02* (2006.01)
(52) U.S. Cl. ........................ 219/482; 219/501; 219/492
(58) Field of Classification Search .................. 219/482, 219/494, 497, 499, 501
See application file for complete search history.

(56) References Cited

U.S. PATENT DOCUMENTS

| | | | | |
|---|---|---|---|---|
| 4,882,909 A * | 11/1989 | Terauchi | .......................... | 62/209 |
| 5,811,948 A | 9/1998 | Sato et al. | | |
| 6,894,465 B2 | 5/2005 | Sutardja et al. | | |
| 6,933,711 B2 | 8/2005 | Sutardja et al. | | |
| 6,977,492 B2 | 12/2005 | Sutardja et al. | | |
| 6,979,988 B2 | 12/2005 | Sutardja et al. | | |
| 7,009,372 B2 | 3/2006 | Sutardja et al. | | |
| 7,023,192 B2 | 4/2006 | Sutardja et al. | | |
| 7,042,202 B2 | 5/2006 | Sutardja et al. | | |
| 7,053,594 B2 | 5/2006 | Sutardja et al. | | |
| 7,317,304 B2 | 1/2008 | Sunaga et al. | | |
| 7,358,711 B2 | 4/2008 | Sutardja et al. | | |
| 7,369,378 B2 | 5/2008 | Sunaga et al. | | |
| 7,411,377 B2 | 8/2008 | Sutardja et al. | | |
| 7,573,249 B2 | 8/2009 | Sutardja et al. | | |
| 7,609,043 B2 | 10/2009 | Sutardja et al. | | |
| 7,622,904 B2 | 11/2009 | Sutardja et al. | | |
| 7,863,880 B1 | 1/2011 | Sutardja et al. | | |
| 2002/0047690 A1* | 4/2002 | Okamoto et al. | ............... | 322/14 |
| 2006/0140286 A1 | 6/2006 | Goto et al. | | |

FOREIGN PATENT DOCUMENTS

| | | |
|---|---|---|
| JP | A-05-344642 | 12/1993 |
| JP | A-07-046853 | 2/1995 |
| JP | A-09-042096 | 2/1997 |
| JP | A-2002-043910 | 2/2002 |
| JP | A-2002-268602 | 9/2002 |
| JP | A-2003-333839 | 11/2003 |
| JP | A-2005-185053 | 7/2005 |
| JP | A-2005-191852 | 7/2005 |

(Continued)

OTHER PUBLICATIONS

Office Action dated Dec. 3, 2008 in corresponding Japanese patent application No. 2007-052747 (and English translation).
Office Action mailed Dec. 9, 2008 in corresponding Japanese patent application No. 2007-052747 (and English translation).

*Primary Examiner* — Mark Paschall
(74) *Attorney, Agent, or Firm* — Posz Law Group, PLC

(57) ABSTRACT

A PWM driver for driving an electric device by a PWM signal includes an ECU that provides a command signal, first circuit that provides a carrier signal of a triangular shape having a preset frequency, a second circuit that forms a PWM signal having a duty ratio formed based on the carrier signal and the command signal and an output circuit that drives an output device. The second circuit includes a duty ratio limiting circuit that limits the duty ratio of the PWM signal to a range between a first duty ratio and a second duty ratio to prevent the wave shape of the PWM signal from becoming a shape of an impulse.

14 Claims, 4 Drawing Sheets

FOREIGN PATENT DOCUMENTS

| | | |
|---|---|---|
| JP | A-2005-261012 | 9/2005 |
| JP | A-2005-348288 | 12/2005 |
| JP | A-2006-054912 | 2/2006 |
| JP | A-2006-303992 | 11/2006 |

* cited by examiner

NOISE REDUCED PWM DRIVER

CROSS REFERENCE TO RELATED APPLICATION

The present application is based on and claims priority from Japanese Patent Application 2007-52747, filed Mar. 2, 2007, the contents of which are incorporated herein by reference.

BACKGROUND OF THE INVENTION

1. Field of the Invention

The present invention relates to a PWM driver that switches an electric device on or off according to a PWM (pulse width modulation) signal.

2. Description of the Related Art

A PWM driver for controlling an electric device such as a motor or an electric heater sometimes encounters radio noises caused by high-frequency noises generated during PWM operation of the electric device. For example, a passenger of a vehicle may have a noise problem when the passenger is hearing music or some other program on a car audio set.

In order to solve this problem, JP-A-2005-185053 proposes to form the pulse shape of the PWM signal into a trapezoid whose rising and falling portions are controlled by the duty ratio thereof. JP-A-2006-187173 proposes to change the cycle of a carrier signal according to a preset pattern or randomly. The above proposals aim to prevent the frequency spectrum of high-frequency noises from concentrating at the same frequency band.

However, more high-frequency noises are generated where the duty ratio of the PWM signal is lower than a lower threshold value or higher than a higher than a higher threshold value, as shown in FIG. 5.

It has been found that this is caused because the carrier signal is shaped into an impulse where the on-duty of the PWM signal is lower than a lower threshold value as shown in FIG. 4B, or the on-duty of the PWM signal is higher than a higher threshold value as shown in FIG. 4C.

In this case, the above-described PWM drivers can not reduce these high frequency noises.

SUMMARY OF THE INVENTION

Therefore, an object of the invention is to provide an improved PWM driver that can effectively reduce high-frequency noise generated during PWM switching control.

According to a feature of the invention, a PWM driver for driving an electric device by a PWM signal includes input means for providing a command signal, first means for providing a carrier signal of a triangular shape having a preset frequency, second means for forming a PWM signal having a duty ratio based on the carrier signal and the command signal and output means for driving an output device, wherein the second means includes duty ratio limiting means for limiting the duty ratio of the PWM signal to a range between a first duty ratio $D\alpha$ and a second duty ratio $D\beta$ to prevent the wave shape of the PWM signal from becoming a shape of an impulse.

Therefore, radio noises caused during PWM control operation are suppressed or reduced, thereby solving the above-stated problem.

In addition to the above features, the following features are also provided: assuming that the carrier signal of the PWM signal has a cycle $T1$, a rising time $Tr$, a falling time $Tf$ and a conducting period $T2$, the first duty ratio $D\alpha$ is not smaller than $(Tr+Tf)/T1$; the second duty ratio $D\beta$ is not larger than $100-(Tr+Tf)/T1$; and the second means forms a PWM signal having 100% duty ratio when the command signal becomes higher than a level that corresponds to the second duty ratio $D\beta$; the output device is an electric heater.

According to another feature of the invention, a method of driving an output device by PWM-controlled electric power includes setting a lower limit duty ratio $D\alpha$ of the PWM-controlled electric power and an upper limit duty ratio $D\beta$ of the PWM-controlled electric power and supplying the PWM-controlled electric power to the output device if the duty ratio is between the lower limit duty ratio $D\alpha$ and the upper limit duty ratio $D\beta$.

In addition to the above features, the following features are also provided: assuming that the PWM-controlled electric power has a cycle $T1$, a rising time $Tr$, a falling time $Tf$ and a conducting period $T2$, the lower limit duty ratio $D\alpha$ is not smaller than $(Tr+Tf)/T1$; and the upper limit duty ratios $D\beta$ is not larger than $100-(Tr+Tf)/T1$.

It is also desirable to add the following features to the above features: cutting supply of the PWM-controlled electric power if the duty ratio becomes lower than the lower limit duty ratio $D\alpha$; and supplying the PWM-controlled electric power having 100% duty ratio if the duty ratio becomes higher than the upper limit duty ratio $D\beta$.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

A PWM driver according to a preferred embodiment of the present invention will be described with reference to the appended drawings.

The PWM driver is to be employed to control a PTC (positive temperature coefficient) heater of a vehicle air condition system.

Figure 1:
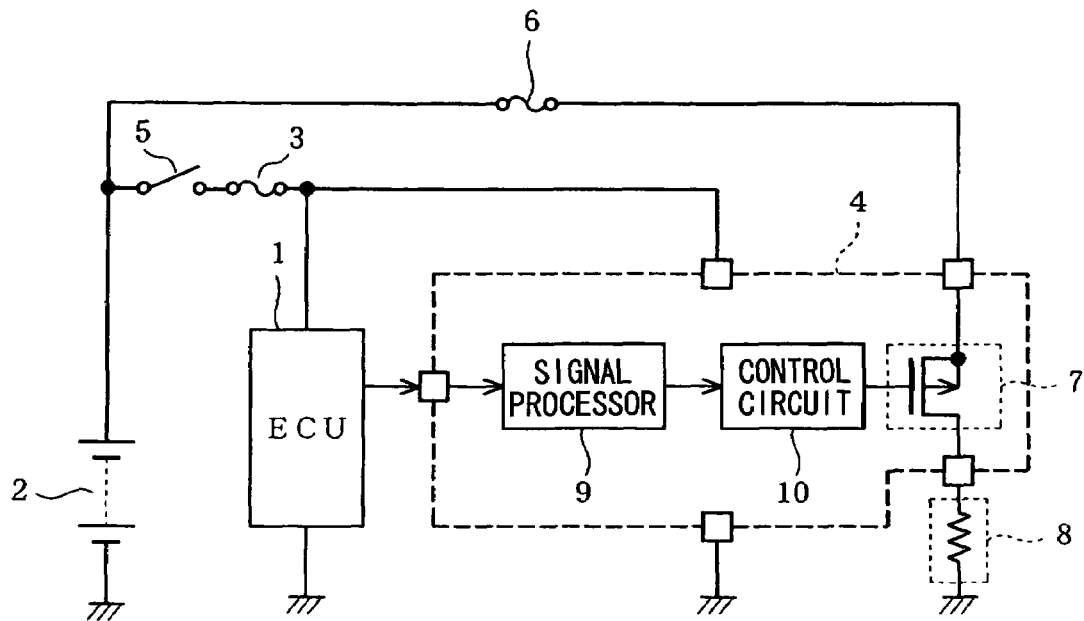
FIG. 1 is a block diagram illustrating a PWM driver according to a preferred embodiment of the invention.

As shown in FIG. 1, the air condition system includes an ECU (electronic control unit) 1, a battery 2, a first fuse 3, a PWM driver 4, a key switch 5, a second fuse 6, a PTC heater 8, etc. The ECU 1 is powered by the battery 2 via the first fuse 3 and the key switch 5. The PWM driver 4 is also powered by the battery 2 via the first fuse 3 and the key switch 5. The PWM driver 4 includes a P-channel MOSFET 7, an input signal processor 9 and a driver control circuit 10. The MOSFET 7 and the PTC heater 8 are connected in series to be separately powered by the battery 2 via the second fuse 6. The ECU 1 provides the PWM driver 4 with a digital command signal when a user operates the air condition system. The input signal processor 9 converts the digital command signal into an analog signal, which is sent to the driver control circuit 10.

Figure 2:
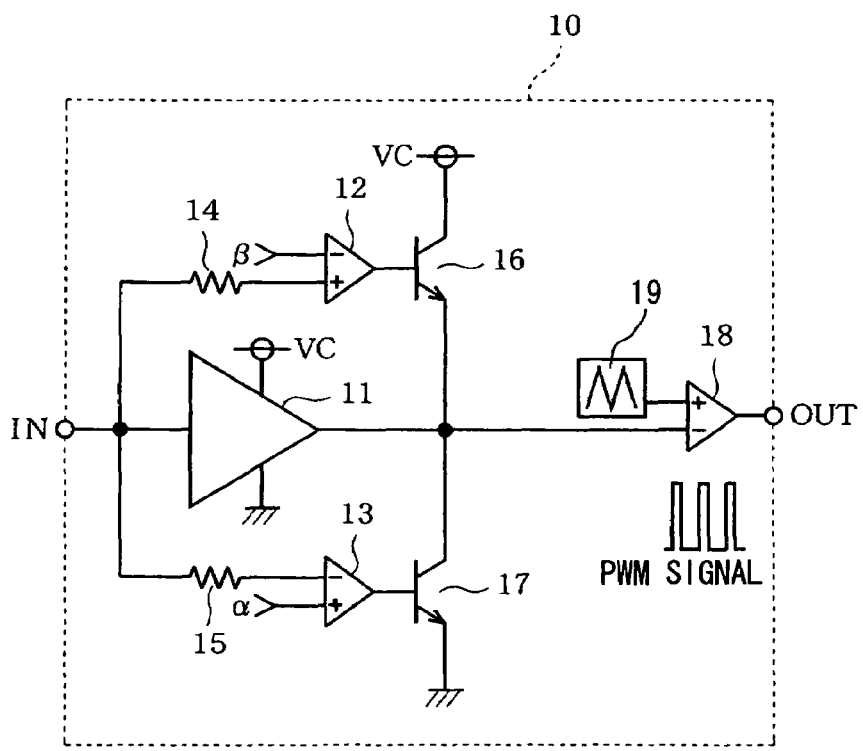
FIG. 2 is a circuit diagram of a control circuit of the PWM driver.

As shown in FIG. 2, the driver control circuit 10 includes a buffer 11, a battery-side comparator 12, a ground-side comparator 13, resistors 14, 15, a pair of transistors 16, 17 connected in a totem-pole-series-connection and a final-stage comparator 18.

The input terminal IN of the driver control circuit 10 is connected with the input terminal of the buffer 11, and is also connected to a non-inverting (+) terminal of the battery-side comparator 12 and an inverting (−) terminal of the ground-side comparator 13 through respective resistor elements 14, 15. The pair of series-connected transistors 16, 17 is connected between a voltage source VC and a ground. The junction of the transistors 16, 17 is connected with the output terminal of the buffer 11. The output terminal of the comparators 12, 13 are respectively connected with the bases of the transistors 16, 17. The output terminal of the buffer 11 is also connected with the inverting terminal of the final-stage comparator 18. The comparator 18 has a non-inverting terminal (+) connected with a triangular carrier wave generator 19 that provides a triangular wave signal of 100 Hz. Therefore, the comparator 18 provides a PWM signal whose level becomes high when the triangular wave signal is higher than the output signal of the buffer 11 and becomes low when the triangular wave signal is not higher than the output signal of the buffer 11. The MOSFET 7 turns on when the level of the PWM signal becomes low.

Further, the (+) terminal of the ground-side comparator 13 and the (−) terminal of the battery-side comparator 12 are applied with comparison voltage levels $\alpha$ and $\beta$, which are voltage levels corresponding to $\alpha$ % and $\beta$ % of a duty-ratio command of the PWM signal. That is to say, the threshold voltage $\alpha$ is applied to the non-inverting terminal of the ground-side comparator 13, and the threshold voltage $\beta$ is applied to the inverting terminal of the battery-side comparator 12.

Therefore, when the input signal IN of the buffer 11 is lower than the threshold voltage $\alpha$ (i.e., $IN \leq \alpha$), the output signal of the ground-side comparator 13 becomes high, so that the transistor 17 turns on to connect the inverting terminal (−) of the final-stage comparator 18 with the ground. On the other hand, when the input signal IN of the buffer 11 is higher than the threshold voltage $\beta$ (i.e., $IN \geq \beta$), the output signal of the battery-side comparator 12 becomes high, and the transistor 16 turns on, connecting the non-inverting (−) terminal of the final-stage comparator 18 with the voltage source VC, such that the non-inverting terminal of the comparator 18 attains a voltage level of the source VC. Further in the case where the input signal of the buffer 11 is lower than the threshold voltage $\beta$ and higher than the threshold level a (i.e., $\alpha < IN < \beta$), the output signals of both the comparators 12, 13 become low, and both the transistors 16, 17 are turned off. The inverting terminal (−) of the final-stage comparator 18 becomes the voltage level of the output signal of the buffer 11, and provides the PWM signal shown in FIG. 4A.

As indicated above, the PTC heater 8 is thus PWM-controlled in a range between a first duty ratio D$\alpha$ that corresponds to the threshold voltage $\alpha$ and a second duty ratio D$\beta$ that corresponds to the threshold voltage $\beta$. The PTC heater 8 is thus fully turned off when the duty ratio of the PWM signal becomes smaller than the first duty ratio D$\alpha$, and is fully turned on when the duty ratio of the PWM signal becomes larger than the second duty ratio D$\beta$.

Figure 4A:
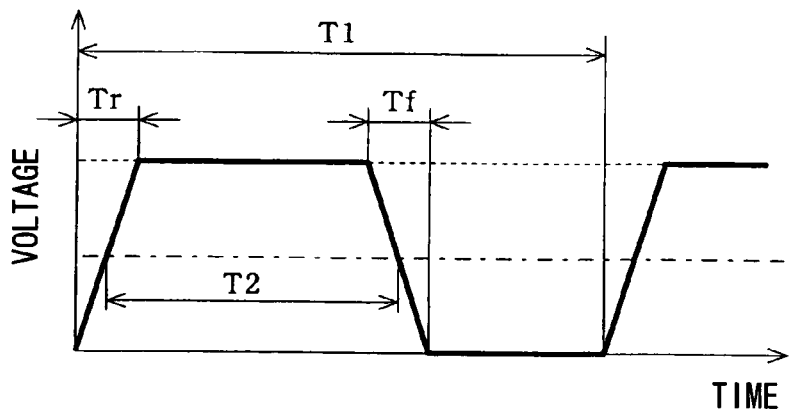
FIGS. 4A, 4B and 4C are graphs showing wave shapes of the PWM signal when the duty ratio of the PWM signal changes.
Figure 4B:
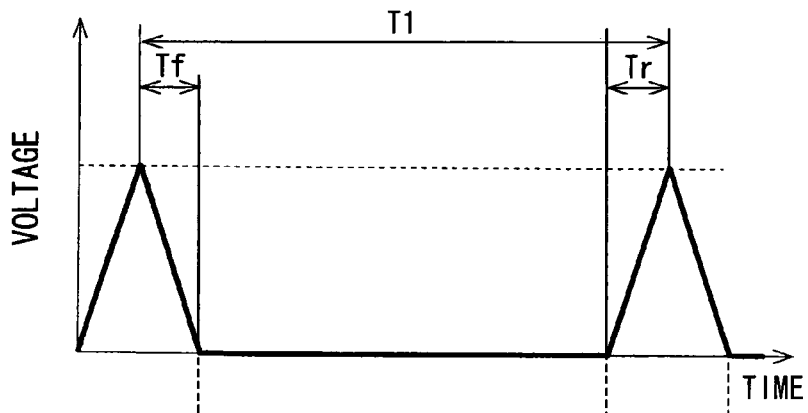
Figure 4C:
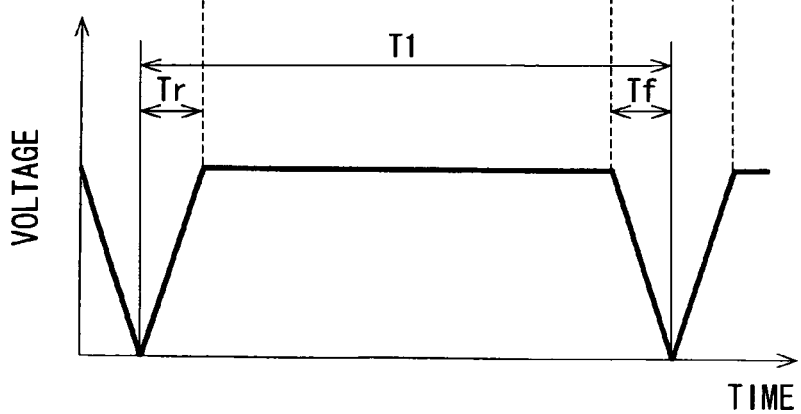
Figure 5:
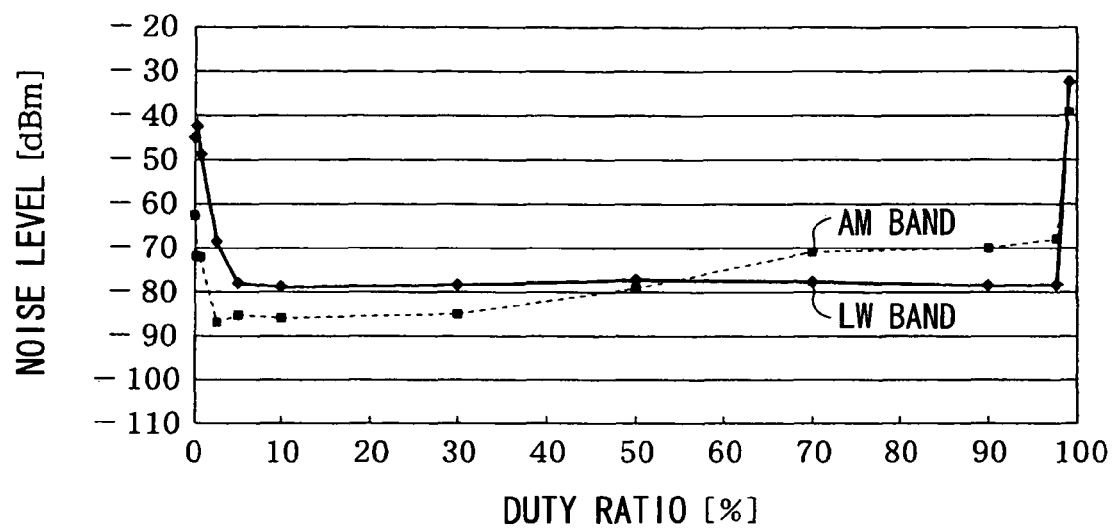
FIG. 5 is a graph showing a relation between duty ratios of a PWM signal and high frequency noise levels contained in AM band (between 510 kHz and 1710 kHz) and LW band (between 150 kHz and 280 kHz).

An operation of the present embodiment will be further described with reference to FIGS. 3A, 3B, 4A, 4B, 4C, and 5. It should first be noted that FIG. 5 shows measured noise levels [dBm] observed in the LW band (150 kHz-280 kHz) and the AM band (510 kHz-1710 kHz) in a case where a duty ratio is varied from 0% to 100% when carrier frequency of a PWM signal is 100 Hz and switching speed of the MOSFET 7 is 100 μs. As indicated above, each of the frequency bands, the noise level is increased where the duty ratio is close to 0% and close to 100%.

Figure 3A:
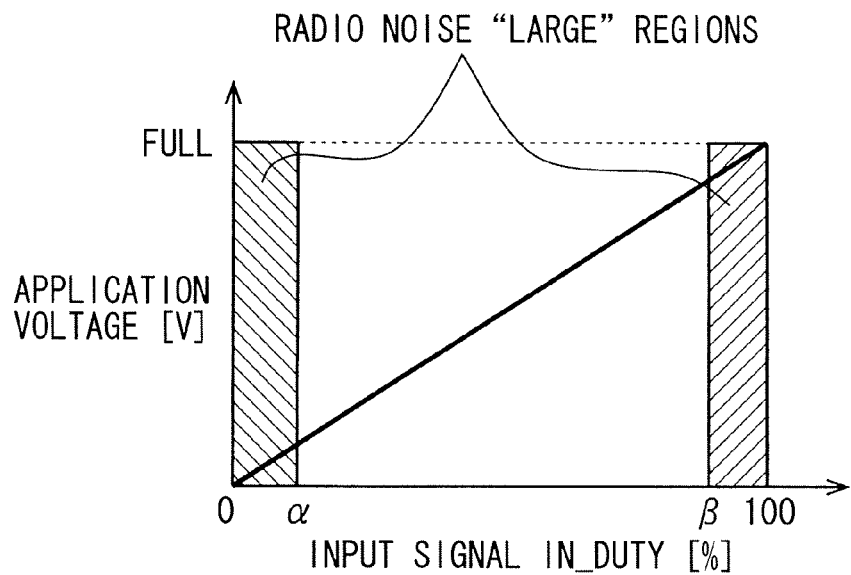
FIGS. 3A and 3B are graphs showing conditions where an upper limit value and a lower limit value are determined with regard to a duty ratio.
Figure 3B:
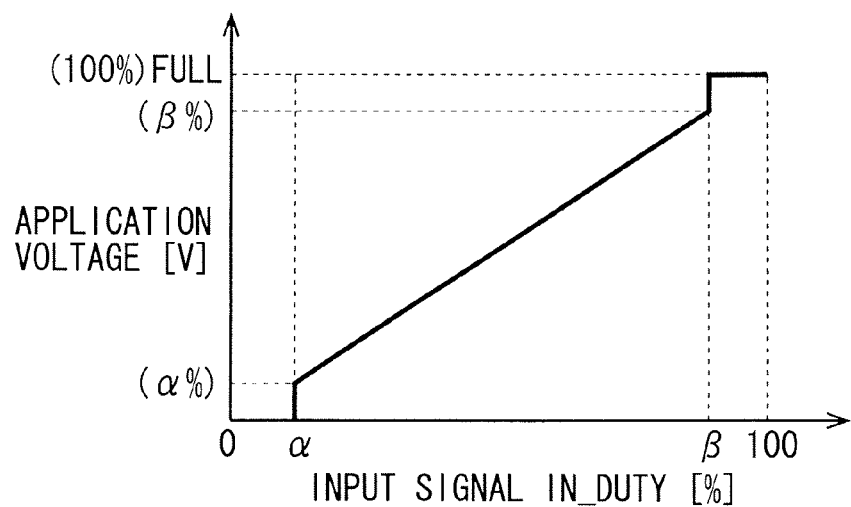

In the present embodiment, as shown in FIG. 3A, the $\alpha$ % that is close to the duty ratio of 0% and the $\beta$ % that is close to the duty ratio of 100% are set as the values for the lower limit and upper limit thresholds. As described above, the drive control circuit 10 is configured such that, when the duty ratio command indicated by the level of the input signal IN is equal to or lower than $\alpha$ %, the MOSFET 7 is fully turned OFF to stop electric conduction to the PTC heater 8, and when the duty ratio command is equal to or higher than $\beta$ %, the MOSFET 7 is fully turned ON (duty ratio 100%) to continuously conduct the PTC heater 8. Please see FIG. 3B. Because a substantial PWM control range is set to $\alpha$ %<IN<$\beta$ %, the switching drive by the MOSFET 7 in the region where the noise level becomes high is avoided, and generation of noise can be restricted.

A determination of the thresholds $\alpha$ and $\beta$ will now be explained with reference to FIG. 4. FIG. 4A is a time chart showing a drive waveform of the load by the PWM signal, in which a carrier wave cycle is defined as T1. In an actual drive waveform, a rising time Tr, where a drive state shifts from a non-conduction state to a conduction state, and a falling time Tf, where the drive state shifts from the conduction state to the non-conduction state, exist. A period in the electrical conduction state is defined as T2.

The ON duty ratio D of the PWM signal is expressed as follows: D=T2/T1. The PWM signal having the first and second duty ratios D$\alpha$, D$\beta$ are respectively set according to FIGS. 4B and 4C. For example, the first and second duty ratios D$\alpha$, D$\beta$ thereof are respectively set as now described.

If the duty ratio is reduced and the electrical conduction time T2 becomes short, an ON pulse width of the PWM signal is reduced. Thus, the signal waveform is ultimately indicated only by the rising time Tr and the falling time Tf, and thus approximates to the form of an impulse. In this case, the change in conducting electric current becomes large, and a level of generated noises increases. Therefore, the threshold duty ratio D$\alpha$ is defined by an expression (1):

$$D\alpha = (Tr+Tf)/T1 \quad (1).$$

On the other hand, if the duty ratio increases and the electrical conduction time T2 increases, an OFF pulse width of the PWM signal is reduced and the ON pulse width is increased. Further, the OFF pulse waveform is ultimately indicated only by the falling time Tf and the rising time Tr, and approximates to the form of an impulse. Also in this case, the change in conduction electric current becomes large, and the level of generated noises increases. Therefore, the threshold duty ratio $\beta$ is defined by expression (2):

$$D\beta = 100 - (Tr+Tf)/T1 \quad (2)$$

Accordingly, in the present embodiment, with regard to the duty ratio of the PWM signal, the lower limit value and the upper limit value are set such that the wave shape of the PWM signal can be prevented from becoming a shape of an impulse, so that high frequency noises can be prevented. The switching drive by the PWM signal is prohibited in the region equal to or lower than the lower limit value and the region equal to or higher than the upper limit value. By setting the lower limit value α and the upper limit value β of the duty ratio in accordance with the frequency bands where noise problems arise depending on the actual operation environment of the driving device 4, the influence of the noises can be restricted.

As a result of the above, the driver or passenger can enjoy music or some other programs on a audio set without radio noises even when the PTC heater 8 is being operated. Further, assuming that the carrier wave cycle of the PWM signal is T1, the rising time of the PWM signal pulse is Tr, the falling time of the pulse is Tf, the lower limit duty ratio Dα is set to (Tr+Tf)/T1 and the upper limit duty ratio Dβ is set to 100−(Tr+Tf)/T1, the driving control by the PWM signal can be performed in as wide range as possible while restricting the noise generation level.

The present invention is not limited to the embodiment described above and illustrated in the drawings, but can be modified or expanded as follows.

In the region equal to or higher than the upper limit value β, the duty ratio Dβ % of the PWM signal is set to 100%, and there is no region where the OFF duty is small. Therefore, the PTC heater 8 can be driven by maximum power, and the full capacity of the PTC heater 8 can be utilized. In this case, a relay may be connected in parallel MOSFET 7. It is also possible to fully turn off the PTC heater 8 if the duty ratio of the PWM signal becomes larger than the second threshold β in a similar manner to when the duty ratio is lower than the lower limit value α.

The load is not limited to a heat generating member such as the PTC heater 8, but can be a motor or a solenoid.

A switching element is not limited to the MOSFET 7 but may be replaced by other elements such as a bipolar transistor or an IGBT (insulated gate bipolar transistor) or the like.

It is not necessary to linearly change the duty ratio in the region of α<IN<β.

The carrier frequency of the PWM signal can be suitably modified depending on an individual design.

Lastly, it is not always necessary to set the lower limit duty ratio α % and the upper limit duty ratio β % based on the expressions (1) and the expression (2), respectively, but can be set to suitable values, such as duty ratios 10%, 90%, depending on an actual application. The main consideration is that the wave shape of the PWM signal be prevented from becoming a shape of an impulse.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A load driving device, that drives operation of a load, comprising a Pulse Width Modulation (PWM) driver circuit that outputs a PWM signal, the PWM driver circuit:
    having a set lower limit value and a set upper limit value,
    having a duty ratio of the PWM signal set to 0% when an input signal to the PWM driver circuit is equal to or lower than the lower limit value, and
    having the duty ratio of the PWM signal set to 100% when the input signal to the PWM driver circuit is equal to or higher than the upper limit value.

2. The load driving device according to claim 1, wherein, a carrier wave cycle of a carrier signal of the PWM signal is T1,
    a pulse of the PWM signal has a rising time that is Tr,
    the pulse of the PWM signal has a falling time that is Tf,
    the lower limit value is defined by $$(Tr+Tf)/T1, \text{ and}$$

the upper limit value is defined by $$100-(Tr+Tf)/T1.$$

3. The load driving device according to claim 1, wherein the load is a heat generating member.

4. The load driving device according to claim 1, wherein the PWM driver circuit comprises:
    a carrier wave generator that generates a triangular carrier wave; and
    a comparator that compares the input signal to the PWM driver circuit with the triangular carrier wave, wherein
    when the input signal to the PWM circuit drive is equal to or lower than the lower limit value, the input signal is lower than the triangular carrier wave at all times such that the comparator outputs the PWM signal with a duty ratio of 0%, and
    when the input signal to the PWM circuit drive is equal to or higher than the higher limit, the input signal is higher than the triangular carrier wave at all times such that the comparator outputs the PWM signal with a duty ratio of 100%.

5. The load driving device according to claim 1, wherein the load is an electric heater.

6. A load driving method in a load driving device, including a Pulse Width Modulation (PWM) driver circuit that outputs a PWM signal, the method comprising:
    setting a lower limit value and an upper limit value;
    the PWM driver circuit outputting a PWM signal with a duty ratio set to 0% when an input signal to the PWM driver circuit is equal to or lower than the lower limit value; and
    the PWM driver circuit outputting a PWM signal with a duty ratio set to 100% when the input signal to the PWM driver circuit is equal to or higher than the upper limit value.

7. The load driving method according to claim 6, wherein a carrier wave cycle of a carrier signal of the PWM signal is T1,
    a pulse of the PWM signal has a rising time that is Tr,
    the pulse of the PWM signal has a falling time that is Tf, and the method further comprises:
    setting the lower limit value as $$(Tr+Tf)/T1, \text{ and}$$

setting the upper limit value as $$100-(Tr+Tf)/T1.$$

8. The load driving method according to claim 6, wherein the load is a heat generating member.

9. The load driving method according to claim 6, wherein the PWM driver circuit further comprises:
    a carrier wave generator for generating a triangular carrier wave; and
    a comparator for comparing the input signal with the triangular carrier wave, and wherein
    when the input signal to the PWM driver circuit is equal to or lower than the lower limit value, the input signal is lower than triangular carrier wave at all times, the comparator thereby outputting the PWM signal with the duty ratio set to 0%, and when the input signal to the PWM driver circuit is equal to or higher than the upper limit value, the input signal is higher than triangular carrier wave at all times, the comparator thereby outputting the PWM signal with the duty ratio set to 100%.

10. The load driving method according to claim 6, wherein the load is an electric heater.

11. A load driving device, that drives operation of a load, comprising a Pulse Width Modulation (PWM) driver circuit that outputs a PWM signal, the PWM driver circuit:

having a set lower limit value and a set upper limit value,
having a duty ratio of the PWM signal set to 0% when an input signal to the PWM driver circuit is equal to or lower than the lower limit value,
having the duty ratio of the PWM signal set to 100% when the input signal to the PWM driver circuit is equal to or higher than the upper limit value and when a first conditions is satisfied, and
having the duty ratio of the PWM signal set to 0% when the input signal to the PWM driver circuit is equal to or higher than the upper limit value and when the first condition is not satisfied.

12. The load driving device according to claim 11, wherein the PWM driver circuit comprises:

a carrier wave generator that generates a triangular carrier wave; and
a comparator that compares the input signal to the PWM driver circuit with the triangular carrier wave, wherein
when the input signal to the PWM circuit drive is equal to or lower than the lower limit value, the input signal is lower than the triangular carrier wave at all times such that the comparator outputs the PWM signal with a duty ratio of 0%,
when the input signal to the PWM circuit drive is equal to or higher than the higher limit, the input signal is higher than the triangular carrier wave at all times, and additionally when the first condition is satisfied, the comparator outputs the PWM signal with a duty ratio of 100%, and
when the input signal to the PWM circuit drive is equal to or higher than the higher limit, the input signal is higher than the triangular carrier wave at all times, and additionally when the first condition is not satisfied, the comparator outputs the PWM signal with a duty ratio of 0%.

13. A load driving method in a load driving device, including a Pulse Width Modulation (PWM) driver circuit that outputs a PWM signal, the method comprising:

setting a lower limit value and an upper limit value;
the PWM driver circuit outputting a PWM signal with a duty ratio set to 0% when an input signal to the PWM driver circuit is equal to or lower than the lower limit value;
the PWM driver circuit outputting a PWM signal with a duty ratio set to 100% when the input signal to the PWM driver circuit is equal to or higher than the upper limit value and when a first condition is satisfied; and
the PWM driver circuit outputting a PWM signal with a duty ratio set to 0% when the input signal to the PWM driver circuit is equal to or higher than the upper limit value and when the first condition is not satisfied.

14. The load driving method according to claim 13, wherein the PWM driver circuit further comprises:

a carrier wave generator for generating a triangular carrier wave; and
a comparator for comparing the input signal with the triangular carrier wave, wherein
when the input signal to the PWM driver circuit is equal to or lower than the lower limit value, the input signal is lower than triangular carrier wave at all times, the comparator thereby outputting the PWM signal with the duty ratio set to 0%,
when the input signal to the PWM driver circuit is equal to or higher than the upper limit value, the input signal is higher than triangular carrier wave at all times, and additionally when the first condition is satisfied, the comparator outputs the PWM signal with the duty ratio set to 100%, and
when the input signal to the PWM driver circuit is equal to or higher than the upper limit value, the input signal is higher than triangular carrier wave at all times, and additionally when the first condition is not satisfied, the comparator outputs the PWM signal with the duty ratio set to 0%.

* * * * *